United States Patent
Han et al.

(10) Patent No.: US 10,573,228 B2
(45) Date of Patent: Feb. 25, 2020

(54) DISPLAY PANEL AND DISPLAY DEVICE

(71) Applicant: BOE TECHNOLOGY GROUP CO., LTD., Beijing (CN)

(72) Inventors: Yanling Han, Beijing (CN); Haisheng Wang, Beijing (CN); Xiaoliang Ding, Beijing (CN); Changfeng Li, Beijing (CN); Xue Dong, Beijing (CN); Jing Lv, Beijing (CN); Chunwei Wu, Beijing (CN); Pengpeng Wang, Beijing (CN); Xueyou Cao, Beijing (CN); Ping Zhang, Beijing (CN); Chihjen Cheng, Beijing (CN); Wei Liu, Beijing (CN); Yanan Jia, Beijing (CN); Lijun Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/089,857

(22) PCT Filed: Oct. 24, 2017

(86) PCT No.: PCT/CN2017/107429
§ 371 (c)(1),
(2) Date: Sep. 28, 2018

(87) PCT Pub. No.: WO2018/145486
PCT Pub. Date: Aug. 16, 2018

(65) Prior Publication Data
US 2019/0180674 A1 Jun. 13, 2019

(30) Foreign Application Priority Data

Feb. 9, 2017 (CN) .......................... 2017 1 0071226

(51) Int. Cl.
*G09G 3/32* (2016.01)
*H01L 27/15* (2006.01)
(Continued)

(52) U.S. Cl.
CPC ............. *G09G 3/32* (2013.01); *G06F 3/0412* (2013.01); *G06F 3/0488* (2013.01);
(Continued)

(58) Field of Classification Search
CPC ................... G09G 3/32; G09G 3/2322; G09G 2300/0426; G09G 2300/0439;
(Continued)

(56) References Cited

U.S. PATENT DOCUMENTS 7,932,987 B2 * 4/2011 Chang ................. G02F 1/13452
349/149
9,799,279 B1 * 10/2017 Evans, V ........... H04N 1/00411
(Continued)

*Primary Examiner* — Peter D McLoone
(74) *Attorney, Agent, or Firm* — Nath, Goldberg & Meyer; Joshua B. Goldberg; Scott H. Blackman

(57) ABSTRACT

Provided is a display panel comprising including: a base substrate; a plurality of pixel units, each of which is provided with a light emitting structure, each light emitting structure includes a first electrode, a light emitting layer, and a second electrode sequentially stacked on the base substrate; a plurality of pixel circuits respectively disposed in the pixel units for driving the light emitting structure to emit light; a deforming layer disposed above the second electrodes of the light emitting structures; and one or more heating control circuits respectively disposed in different pixel units and each electrically connected to the second electrode of the light emitting structure in a corresponding pixel unit, the heating control circuit is configured to control the second electrode of the light emitting structure in the corresponding pixel unit to generate heat so that the hardness of the deforming layer above the second electrode changes.

20 Claims, 2 Drawing Sheets

(51) Int. Cl.
*H01L 33/56* (2010.01)
*G06F 3/041* (2006.01)
*H01L 33/38* (2010.01)
*G09G 3/3233* (2016.01)
*G06F 3/0488* (2013.01)

(52) U.S. Cl.
CPC ........... *G09G 3/3233* (2013.01); *H01L 27/15* (2013.01); *H01L 27/156* (2013.01); *H01L 33/38* (2013.01); *H01L 33/56* (2013.01); *G06F 2203/04809* (2013.01); *G09G 2300/0426* (2013.01); *G09G 2300/0439* (2013.01); *G09G 2300/0861* (2013.01); *G09G 2310/0251* (2013.01); *G09G 2310/0262* (2013.01); *G09G 2354/00* (2013.01)

(58) Field of Classification Search
CPC ... G09G 2300/0861; G09G 2310/0251; G09G 2310/0262; G09G 2354/00; G06F 3/0412; G06F 3/0488; G06F 2203/04809; H01L 27/15; H01L 27/156; H01L 33/38; H01L 33/56
See application file for complete search history.

(56) References Cited

U.S. PATENT DOCUMENTS

| | | | | |
|---|---|---|---|---|
| 9,996,158 | B2* | 6/2018 | Evans, V | H04N 1/00411 |
| 10,345,905 | B2* | 7/2019 | McClure | G06F 1/1652 |
| 2010/0156444 | A1* | 6/2010 | Ponjee | B01L 3/5027 |
| | | | | 324/703 |
| 2010/0182559 | A1* | 7/2010 | Chang | G02F 1/133382 |
| | | | | 349/150 |
| 2012/0133494 | A1* | 5/2012 | Cruz-Hernandez | G06F 3/016 |
| | | | | 340/407.2 |
| 2014/0313142 | A1* | 10/2014 | Yairi | G06F 3/016 |
| | | | | 345/173 |
| 2017/0068318 | A1* | 3/2017 | McClure | G06F 3/016 |
| 2017/0337904 | A1* | 11/2017 | Du | G09G 3/32 |
| 2018/0074586 | A1* | 3/2018 | Evans, V | H04N 1/00411 |

* cited by examiner

US 10,573,228 B2

DISPLAY PANEL AND DISPLAY DEVICE

CROSS-REFERENCE TO RELATED APPLICATION

This is a National Phase Application filed under 35 U.S.C. 371 as a national stage of PCT/CN2017/107429, filed Oct. 24, 2017, an application claiming the benefit of Chinese Application No. 201710071226.4, filed Feb. 9, 2017, entitled "Display Panel and Display Device" the entire contents of which are hereby incorporated by reference.

TECHNICAL FIELD

The present application relates to the field of display devices, and in particular, to a display panel and a display device including the display panel.

BACKGROUND

A touch display device such as a mobile phone, a tablet computer, a navigator or the like generally has a flat surface. In order to operate the display device, the device holder needs to stare at the display screen of the display device.

Therefore, how to enable the holder to conveniently operate the display device without looking at the display screen becomes a technical problem to be solved urgently in the field.

SUMMARY

The present application provides a display panel, including: a base substrate; a plurality of pixel units, each of which is provided with a light emitting structure, each light emitting structure includes a first electrode, a light emitting layer, and a second electrode which are sequentially stacked on the base substrate; a plurality of pixel circuits respectively disposed in the pixel units for driving the light emitting structure to emit light; a deforming layer disposed above the second electrode of the light emitting structure; and one or more heating control circuits respectively disposed in different pixel units and each electrically connected to the second electrode of the light emitting structure in a corresponding pixel unit in which the heating control circuit is provided, wherein the heating control circuit is configured to control the second electrode of the light emitting structure in the corresponding pixel unit to generate heat so that hardness of the deforming layer above the second electrode changes.

In some embodiments, the pixel circuit includes a driving sub-circuit, an input terminal of the driving sub-circuit is connected to a first level signal terminal, and an output terminal of the driving sub-circuit is connected to the first electrode of the light emitting structure, the second electrode of the light emitting structure is connected to a second level signal terminal, and an input terminal of the heating control circuit is connected to the output terminal of the driving sub-circuit of the corresponding pixel circuit, an output terminal of the heating control circuit is connected to the second electrode of the light emitting structure of the corresponding pixel circuit, the heating control circuit is configured to electrically connect the input terminal and the output terminal of the heating control circuit to control the second electrode of the light emitting structure in the corresponding pixel unit to generate heat when a valid signal is received by a control terminal of the heating control circuit, so that the hardness of the deforming layer above the second electrode of the corresponding light emitting structure changes.

In some embodiments, the deforming layer includes a material of polymer hydrogel.

In some embodiments, the display panel further includes: an encapsulation layer disposed above the deforming layer to encapsulate the deforming layer.

In some embodiments, the encapsulation layer includes a material of tetrafluoroethylene.

In some embodiments, second electrodes of a plurality of light emitting structures are integrally formed to form a second electrode block, and a space is formed between adjacent second electrode blocks.

In some embodiments, one second electrode block is controlled by one heating control circuit.

In some embodiments, the heating control circuit includes a control transistor, a gate of the control transistor is connected to a control terminal of the heating control circuit, a first electrode terminal of the control transistor is connected to the input terminal of the heating control circuit, and a second electrode terminal of the control transistor is connected to the output terminal of the heating control circuit.

In some embodiments, the light emitting structure includes a light emitting diode, the first electrode is formed as an anode of the light emitting structure, and the second electrode is formed as a cathode of the light emitting structure, the pixel circuit further includes a grayscale signal input sub-circuit, a reset sub-circuit, and a light emitting control sub-circuit, wherein the reset sub-circuit is configured to reset the control terminal of the driving sub-circuit; an input terminal of the light emitting control sub-circuit is connected to the output terminal of the driving sub-circuit, an output terminal of the light emitting control sub-circuit is connected to the first electrode of the light emitting structure in the pixel unit in which the light emitting control sub-circuit is provided, and the input terminal and the output terminal of the light emitting control sub-circuit are electrically connected in a case where a valid control signal is received by the control terminal of the light emitting control sub-circuit.

In some embodiments, the driving sub-circuit includes a driving transistor and a storage capacitor, a gate of the driving transistor is connected to a first end of the storage capacitor, a first electrode terminal of the driving transistor is connected to the input terminal of the driving sub-circuit, and a second electrode terminal of the driving transistor is connected to the output terminal of the driving sub-circuit, a second end of the storage capacitor is connected to the control terminal of the drive sub-circuit.

In some embodiments, the reset sub-circuit includes a first reset transistor and a second reset transistor, and a gate of the first reset transistor and a gate of the second reset transistor are both connected to the control terminal of the reset sub-circuit, a first electrode terminal of the first reset transistor is connected to an initial signal input terminal, and a second electrode terminal of the first reset transistor is connected to the gate of the driving transistor; a first electrode terminal of the second reset transistor is connected to the first level signal terminal, and a second electrode terminal of the second reset transistor is connected to the second end of the storage capacitor.

In some embodiments, the grayscale signal input sub-circuit includes a first input transistor, a second input transistor, and a third input transistor, and a gate of the first input transistor is connected to the control terminal of the grayscale signal input sub-circuit, a first electrode terminal of the first input transistor is connected to an output terminal of the grayscale signal input sub-circuit, and a second electrode terminal of the first input transistor is connected to the input terminal of the grayscale signal input sub-circuit; a first electrode terminal of the second input transistor is connected to a reference voltage input terminal, and a second electrode terminal of the second input transistor is connected to the output terminal of the grayscale signal input sub-circuit; a gate of the third input transistor is connected to the gate of the first input transistor, a first electrode terminal of the third input transistor is connected to the first end of the storage capacitor, and a second electrode terminal of the third input transistor is connected to the output terminal of the driving sub-circuit.

In some embodiments, the light emitting control sub-circuit includes a light emitting control transistor, a first electrode terminal of the light emitting control transistor is connected to the input terminal of the light emitting control sub-circuit, a second electrode terminal of the light emitting control transistor is connected to the output terminal of the light emitting control sub-circuit, and a gate of the light emitting control transistor is connected to the control terminal of the light emitting control sub-circuit.

The present application further provides a display device including the display panel provided by the present application.

In some embodiments, the display device further includes a heating driving chip and a display driving chip, the display driving chip is capable of driving the display panel to display selective instructions; the heating driving chip is configured to provide a valid signal to the control terminal of the heating control circuit corresponding to an area of the display panel where the selective instructions are displayed when the display driving chip displays the selective instructions, so that the second electrode of the light emitting structure in the corresponding pixel unit generates heat.

In some embodiments, when the display driving chip drives the display panel to display the selective instructions, a display period of the display device includes a display stage and/or a heating stage, wherein the display driving chip is configured to provide a display signal to the pixel circuit corresponding to the area for displaying the selective instructions during the display stage; and the heating driving chip is configured to provide a valid signal to the control terminal of the heating control circuit corresponding to the area displaying the selective instructions during the heating stage.

In some embodiments, the display stage includes a first initialization sub-stage, a first grayscale signal writing-compensating sub-stage and a light emitting sub-stage, and the heating stage includes a second initialization sub-stage, a second grayscale signal writing-compensating sub-stage and a heating sub-stage, wherein during the first initialization sub-stage and the second initialization sub-stage, signals provided by the display driving chip to the pixel circuits are the same, and the heating driving chip provides an invalid signal to the control terminal of the heating control circuit; during the first grayscale signal writing-compensating sub-stage and the second grayscale signal writing-compensating sub-stage, signals provided by the display driving chip to the pixel circuits are the same, and the heating driving chip provides an invalid signal to the control terminal of the heating control circuit; the display driving chip provides a valid signal to the control terminal of the light emitting control sub-circuit during the heating sub-stage, and provides an invalid signal to the control terminal of the light emitting control sub-circuit during the light emitting sub-stage; and the heating driving chip provides a valid signal to the control terminal of the heating control circuit during the heating sub-stage.

BRIEF DESCRIPTION OF THE DRAWINGS

The accompanying drawings are used to provide further understanding of the present application and constitute a part of the specification, and are used to explain the present application together with the following specific implementations, but are not to be construed as limiting the present application. In the drawings.

REFERENCE SIGNS

110: deforming layer; 120: encapsulation layer; 130: second electrode block; 210: driving sub-circuit; 220: grayscale signal input sub-circuit; 230: reset sub-circuit; 240: light emitting control sub-circuit; 300: heating control circuit.

DETAILED DESCRIPTION

Specific embodiments of the present application will be described in detail below with reference to the accompanying drawings. It should be understood that the specific embodiments described herein are only used to illustrate and explain the present application and are not intended to limit the present application.

Figure 1:
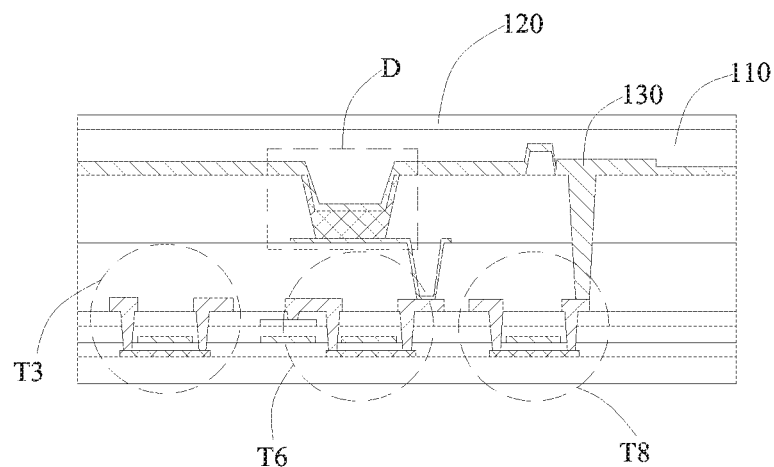
FIG. 1 is a schematic structural diagram of a display panel provided in an embodiment of the present application.
Figure 2:
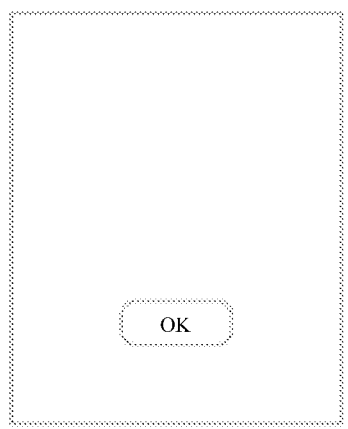
FIG. 2 is a schematic diagram of a display panel displaying a "selective instruction" in an embodiment of the present application.

The positional terms "upper" and "lower" used in this application refer to the "up" and "down" directions in FIG. 1.

As a display panel of the present application, the display panel includes a plurality of pixel units, and each of the pixel units is provided with a light emitting structure D. Each light emitting structure D includes a first electrode, a light emitting layer, and a second electrode sequentially stacked on a base substrate. The display panel also includes a plurality of pixel circuits, a heating control circuit 300, and a deforming layer 110. The pixel circuits are disposed in the pixel units, respectively, and the heating control circuit 300 is disposed in at least one of the pixel units. The deforming layer 110 is disposed above the second electrode of the light emitting structure.

Figure 3:
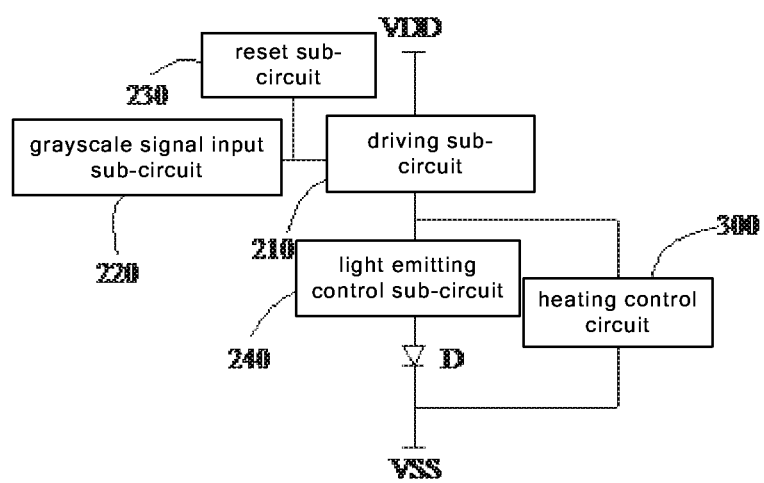
FIG. 3 is a schematic structural diagram of a sub-circuit of a pixel circuit provided with a heating control circuit in a display panel provided in an embodiment of the present application.

As shown in FIG. 3, the pixel circuit includes a driving sub-circuit 210. An input terminal of the driving sub-circuit 210 is connected to a first level signal terminal VDD, an output terminal of the driving sub-circuit 210 is directly or indirectly connected to the first electrode of the light emitting structure D, the second electrode of the light emitting structure D is connected to a second level signal terminal VSS. An input terminal of the heating control circuit 300 is connected to the output terminal of the drive sub-circuit 210 of the corresponding pixel circuit, and an output terminal of the heating control circuit 300 is connected to the second electrode of the light emitting structure D of the corresponding pixel circuit. When a valid signal is received by a control terminal of the heating control circuit 300, the input terminal and the output terminal of the heating control circuit 300 are electrically connected, so that the hardness of the deforming layer above the second electrode of the corresponding light emitting structure D is changed.

The pixel circuit corresponding to the heating control circuit refers to the pixel circuit provided in the pixel unit in which the heating control circuit is provided.

In some special cases (for example, the operator is driving and is inconvenient to watch the display screen), a valid control signal can be provided to the control terminal of the heating control circuit so that the input terminal and the output terminal of the heating control circuit electrically connected. In this way, the first level signal terminal VDD, the heating control circuit 300, the second electrode of the light emitting structure D, and the second level signal terminal VSS form a loop. Since the second electrode of the light emitting structure D has a resistance, heat will be generated when current passes therethrough, resulting in a change in hardness (for example, hardening or softening) of a portion of the deforming layer corresponding to the second electrode generating heat. When touching the surface of the display panel, the operator can distinguish the position to be operated by the difference in hardness, and corresponding operation can be performed.

It should be pointed out that the second electrodes of all light emitting structures D should not be formed as a continuous surface electrode. In an embodiment, the second electrodes of the respective light emitting structures D are separated electrodes, and a space is formed between every adjacent electrodes. In another embodiment, the second electrodes of a plurality of light emitting structures among all the light emitting structures are integrally formed as a second electrode block 130, and a space is formed between every adjacent second electrode blocks 130. The second electrode block 130 has a greater resistance than each separated second electrode, and therefore can generate more heat. A space is formed between two different second electrode blocks 130 so that individual areas of the deforming layer can be separately controlled. That is, it can be achieved that only a target area of the deforming layer is heated without heating other non-target areas. In the present embodiment, one second electrode block is controlled by one heating control circuit.

In an embodiment, the deforming layer feels soft at a room temperature (e.g., 15° C. to 30° C.). When the temperature changes, for example, in a case where the temperature exceeds 30° C., the deforming layer hardens and feels rigid.

In the present application, the specific structure of the deforming layer 110 is not particularly limited. For example, the deforming layer 110 can be a whole piece of film or a layer composed of a plurality of deforming blocks. For ease of fabrication, in an embodiment, the deforming layer 110 can be a whole piece of film. The deforming layer 110 can be provided over the entire display surface of the display panel, alternatively, the deforming layer 110 can be provided only in partial areas of the display surface of the display panel.

One of the first level signal terminal VDD and the second level signal terminal VSS is a high level signal terminal, and the other is a low level signal terminal. Levels of the signals input to the first level signal terminal VDD and the second level signal terminal VSS can be determined according to a specific structure of the light emitting structure D.

In the present application, there is no particular limitation on the specific structure of the light emitting structure D. For example, in the specific embodiments shown in FIG. 3 and FIG. 4, the light emitting structure D is a light emitting diode, the first electrode is an anode, and the second electrode is a cathode. Correspondingly, the first level signal terminal VDD is a high level signal terminal, and the second level signal terminal VSS is a low level signal terminal.

The heating structure of which the second electrode needs to be heated is determined by the current display content of the display panel. For example, the second electrode of the light emitting structure corresponding to the pixel unit displaying the "selective instructions" can be heated. The selective instructions can include "OK", "Yes", "No", and the like.

For example, during navigating, after the navigator sounds a voice prompt "whether to go to the route", an indication of "Yes" can be displayed on the display panel. With the solution of the present embodiment, the deforming layer at the indication is hardened, so that the operator can touch the hardened portion to operate when touching the display panel, and thus can issue a "Yes" instruction to the navigator.

For another example, the display device can control corresponding areas to harden to form Braille that can be recognized by a blind person.

In the present application, "the output terminal of the driving sub-circuit being directly or indirectly connected to the first electrode of the light emitting structure" means that the output terminal of the driving sub-circuit can be directly connected to the first electrode of the light emitting structure, alternatively, can be indirectly to the first electrode of the light emitting structure through other elements (e.g., switching elements).

In the present application, specific material of the deforming layer 110 is not particularly limited as long as it can be hardened upon being heated. In some embodiments, the material of the deforming layer 110 includes a polymer hydrogel, and the display panel further includes an encapsulating layer 120 disposed above the deforming layer 110 to encapsulate the deforming layer 110. In the present application, there is no particular limitation on the specific material of the encapsulation layer 120 as long as it can encapsulate the deforming layer to the display panel. In some embodiments, the material of the encapsulation layer includes tetrafluoroethylene.

In the present application, the number of heating control circuits can be the same as the number of second electrode blocks. Accordingly, each of a part of the pixel circuits can be provided therein with the heating control circuit. In some embodiments, each of the part of the pixel circuits being provided therein with the heating control circuit can simplify the structure of the display panel and the manufacturing process of the display panel can be simplified.

Figure 4:
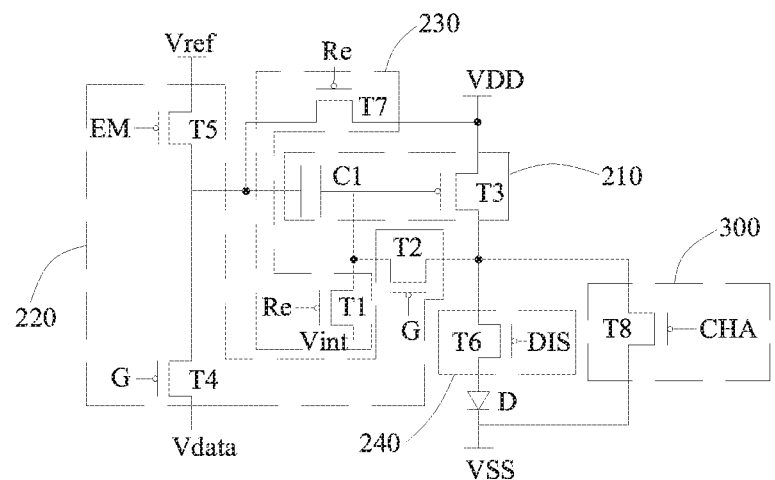
FIG. 4 is a schematic diagram of a pixel circuit provided with a heating control circuit in a display panel provided in an embodiment of the present application.

In the present application, there is no particular limitation on the specific structure of the heating control circuit. In order to simplify the structure of the display panel and reduce the manufacturing cost of the display panel, in some embodiments, as shown in FIG. 4, the heating control circuit 300 can include a control transistor T8. A gate of the control transistor T8 is used as the control terminal of the heating control circuit, a first electrode terminal of the control transistor T8 is used as the input terminal of the heating control circuit, and a second electrode terminal of the control transistor T8 is used as the output terminal of the heating control circuit. When a valid control signal is received by the gate of the control transistor T8, the first electrode terminal and the second electrode terminal of the control transistor T8 are electrically connected, so that the second electrode terminal of the driving transistor T3 and the second electrode of the light emitting structure D are electrically connected. Thus, the first level signal terminal VDD, the second electrode of the light emitting structure D, and the second level signal terminal VSS form a loop, thereby causing the second electrode connected thereto to generate heat.

In the present application, there is no particular limitation on the specific structure of the pixel circuit. For example, as shown in FIG. 3, in a specific embodiment in which the light emitting structure D includes a light emitting diode (the first electrode of the light emitting structure D is formed as an anode, the second electrode of the light emitting structure D is formed as a cathode), the pixel circuit further includes a grayscale signal input sub-circuit 220, a reset sub-circuit 230, and a light emitting control sub-circuit 240.

The reset sub-circuit 230 is configured to reset the control terminal of the driving sub-circuit 210 during a reset stage of the pixel circuit.

An input terminal of the light emitting control sub-circuit 240 is connected to an output terminal of the driving sub-circuit 210, and an output terminal of the light emitting control sub-circuit 240 is connected to the first electrode of the light emitting structure D (i.e., the anode of the light emitting diode) in the pixel unit in which the light emitting control sub-circuit 240 is provided. When a valid control signal is received by a control terminal of the light emitting control sub-circuit 240, the input terminal and the output terminal of the light emitting control sub-circuit 240 are electrically connected. During the light emitting stage of the pixel circuit, the control terminal of the light emitting control sub-circuit 240 receives a valid signal.

In the embodiment shown in FIG. 4, the driving sub-circuit 210 includes a driving transistor T3 and a storage capacitor C1. A gate of the driving transistor T3 is connected to a first end of the storage capacitor C1, a first electrode terminal of the driving transistor T3 is connected to the input terminal of the driving sub-circuit 210, and a second electrode terminal of the driving transistor T3 is connected to the output terminal of the driving sub-circuit 210. A second end of the storage capacitor C1 is connected to the control terminal of the driving sub-circuit 210. The storage capacitor C1 is configured to store and compensate a threshold voltage of the driving transistor T3, thereby preventing the gate voltage of the driving transistor T3 from drifting due to long-time service.

In the embodiment shown in the drawing, the reset sub-circuit 230 includes a first reset transistor T1 and a second reset transistor T7, and a gate of the first reset transistor T1 and a gate of the second reset transistor T7 are both connected to a control terminal Re of the reset sub-circuit 230.

A first electrode terminal of the first reset transistor T1 is connected to an initial signal input terminal Vint, and a second electrode terminal of the first reset transistor T1 is connected to the gate of the driving transistor T3.

A first electrode terminal of the second reset transistor T7 is connected to the first level signal terminal VDD, and a second electrode terminal of the second reset transistor T7 is connected to the second end of the storage capacitor C1.

When the control terminal Re of the reset sub-circuit is provided with a valid signal, both the first reset transistor T1 and the second reset transistor T7 are turned on, so that the gate of the driving transistor T3 and the second end of the storage capacitor C1 can be discharged.

In some embodiments, the grayscale signal input sub-circuit 220 includes a first input transistor T4, a second input transistor T5 and a third input transistor T2. The first input transistor T4 is connected to a control terminal G of the grayscale signal input sub-circuit, a first electrode terminal of the first input transistor T4 is connected to an output terminal of the grayscale signal input sub-circuit, and a second electrode terminal of the first input transistor T4 is connected to an input terminal of the grayscale signal input sub-circuit.

A first electrode terminal of the second input transistor T5 is connected to a reference voltage input terminal Vref, a second electrode terminal of the second input transistor T5 is connected to the output terminal of the grayscale signal input sub-circuit, and a gate of the second input transistor T5 is connected to an enable signal control terminal EM.

A gate of the third input transistor T2 is connected to the gate of the first input transistor T4, that is, both of them are connected to the control terminal G of the grayscale signal input sub-circuit, a first electrode terminal of the third input transistor T2 is connected to the first end of the storage capacitor C1, and a second electrode terminal of the third input transistor T2 is connected to the output terminal of the driving sub-circuit.

When a valid signal is received by the gates of the first input transistor T4 and the third input transistor T2, the first input transistor T4 and the third input transistor T3 are turned on.

In the embodiment shown in FIG. 4, the light emitting control sub-circuit 240 includes a light emitting control transistor T6, a first electrode terminal of the light emitting control transistor T6 is connected to the input terminal of the light emitting control sub-circuit 240, and a second electrode terminal of the light emitting control transistor T6 is connected to the output terminal of the light emitting control sub-circuit 240, and a gate of the light emitting control transistor T6 is connected to the control terminal of the light emitting control sub-circuit 240.

Figure 5:
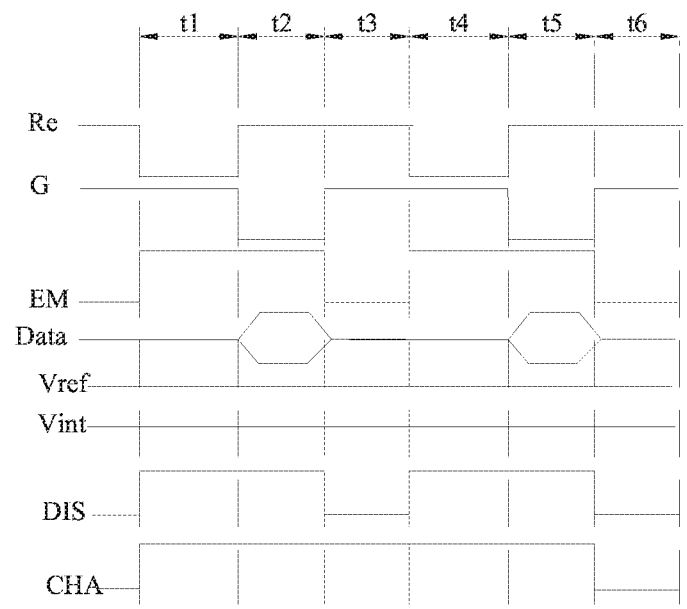
FIG. 5 is a signal timing diagram for displaying of a display panel provided in and embodiment of the present application.

Operation principles of the pixel circuit and the heating control circuit provided in FIG. 4 of the present application will be described below in conjunction with the timing signals in FIG. 5. As shown in FIG. 4, the transistors in the pixel circuit and the heating control transistor T8 are P-type transistors, and are turned on when receiving a low-level signal at their gates. A display stage includes three sub-stages of a first initialization sub-stage t1, a first grayscale signal writing-compensating sub-stage t2 and a light emitting sub-stage t3. A heating stage includes three sub-stages of a second initialization sub-stage t4, a second grayscale signal writing-compensating sub-stage t5 and a heating sub-stage t6.

During the sub-stage t1, that is, the initialization stage of the display panel, a low-level signal is input through the control terminal Re of the reset sub-circuit, a high-level signal is input through the reference voltage input terminal Vref, and a low-level signal is input through the initial signal input terminal Vint, a high-level signal is input through the enable signal input terminal EM, a high-level signal is provided through a control terminal CHA of the heating control circuit, a high-level signal is provided through a control terminal DIS of the light emitting control sub-circuit, and a high-level signal is input through the control terminal G of the grayscale signal input sub-circuit. Accordingly, the first reset transistor T1 and the second reset transistor T7 are turned on, and the initial signal input terminal Vint and the gate of the driving transistor T3 are electrically connected, thereby resetting the driving transistor T3. The light emitting control transistor T6 is turned off, the heating control transistor T8 is turned off, and the driving transistor T3, the first input transistor T4, the second input transistor T5 and the third input transistor T2 are all turned off.

During the sub-stage t2, that is, the data writing-compensating stage of the display panel, a grayscale signal is input through the data signal input terminal Vdata, a high-level signal is input through the control terminal Re of the reset sub-circuit, and a high-level signal is input through the reference voltage input terminal Vref, a low-level signal is input through the initial signal input terminal Vint, a high-level signal is input through the enable signal input terminal EM, a high-level signal is provided through the control terminal CHA of the heating control circuit, and a high-level signal is provided through the control terminal DIS of the light emitting control sub-circuit, and a low-level signal is input through the control terminal G of the grayscale signal input sub-circuit. During this sub-stage, both the grayscale signal and the threshold voltage of the driving transistor T3 are written into the storage capacitor C1, and the third input transistor T2 is turned on, so that the driving transistor T3 plays a role of a diode. In this case, both the light emitting control transistor T6 and the heating control transistor T8 are turned off.

During the sub-stage t3, that is, the light emitting stage of the display panel, a grayscale signal is input through the data signal input terminal Vdata, a high-level signal is input through the control terminal Re of the reset sub-circuit, a high-level signal is input through the reference voltage input terminal Vref, a low-level signal is input through the initial signal input terminal Vint, a low-level signal is input through the enable signal input terminal EM, a high-level signal is provided through the control terminal CHA of the heating control circuit, and a low-level signal is provided through the control terminal DIS of the light emitting control sub-circuit, and a high-level signal is input through the control terminal G of the grayscale signal input sub-circuit. During this stage, the second input transistor T5 is turned on to provide a high-level signal for the storage capacitor C1, and the light emitting control transistor T6 is turned on, so that the light emitting structure D emits light.

After the display stage is completed, the heating stage begins.

In the present embodiment, a control signal is provided to the pixel circuit by a display driving chip, and a heating control signal is provided to the heating control circuit by a heating driving chip. During the first initialization sub-stage t1 and the second initialization sub-stage t4, the signals provided by the display driving chip to the pixel circuit are the same with each other, and the heating driving chip provides an invalid signal to the control terminal of the heating control circuit.

During the first grayscale signal writing-compensating sub-stage t2 and the second grayscale signal writing-compensating sub-stage t5, signal provided by the display driving chip provides to the pixel circuits are the same with each other, and the heating driving chip provides an invalid signal to the control terminal of the heating control circuit.

The difference between the signal provided by the display driving chip to the pixel circuits during the heating sub-stage t6 and the signal provided by the display driving chip during the light emitting sub-stage t3 is that an invalid signal is provided to the control terminal of the light emitting sub-circuit during the heating sub-stage t6. That is to say, signals supplied by the display driving chip to the control terminal and the input terminal of the grayscale signal input sub-circuit of the pixel circuit during the heating sub-stage t6 are the same as signals supplied by the display driving chip to the control terminal and the input terminal of the grayscale signal input sub-circuit of the pixel circuit during the light emitting sub-stage t3, and signals supplied by the display driving chip to the control terminal and the input terminal of the reset sub-circuit of the pixel circuit during the heating sub-stage t6 are the same as signals supplied by the display driving chip to the control terminal and the input terminal of the reset sub-circuit of the pixel circuit during the light emitting sub-stage t3.

In addition, the heating driving chip provides a valid signal to the control terminal of the heating control circuit during the heating sub-stage, so that the input terminal and the output terminal of the heating control circuit can be electrically connected to form a heating loop. The second electrode of the light emitting structure can generate heat to heat corresponding portion of the deforming layer to harden it. On-off conditions of specific transistors are similar to those during the display stage, and will not be described in detail here.

As another aspect of the present application, there is provided a display device, which includes the display panel provided by the present application.

As described above, when the operator is inconvenient to watch the display panel, the portion of the deforming layer corresponding to the portion that needs to be operated can be controlled to be hardened, thereby facilitating the operator to recognize it through touching so as to perform operation.

In some embodiments, the display device includes a heating driving chip and a display driving chip.

The display driving chip can drive the display panel to display selective instructions.

The heating driving chip can provide a valid signal to the control terminal of the heating control circuit corresponding to the area of the display panel where the selective instructions are displayed when the display driving chip displays the selective instructions.

As described above, the selective instructions can include "OK", "Yes", "No", and the like.

In order to enable the display panel to display properly, in some embodiments, when the display driving chip drives the display panel to display selective instructions, a display period of the display device includes a display stage T1 and/or a heating stage T2.

The display driving chip is configured to provide a display signal to the pixel circuit corresponding to the area for displaying the selective instructions during the display stage. The heating driving chip is configured to provide a valid signal (heating control signal) to the control terminal of the heating control circuit in the pixel unit corresponding to the area where the selective instructions are displayed during the heating stage.

The operation principle of the pixel circuit during the display stage is the same as that described above, that is, the display stage T1 includes a first initialization sub-stage t1, a first grayscale signal writing-compensating sub-stage t2 and a light emitting sub-stage t3.

In order to control the second electrode of the light emitting structure to generate heat, in some embodiments, the heating stage T2 includes a second initialization sub-stage t4, a second grayscale signal writing-compensating sub-stage t5 and a heating sub-stage t6.

Specifically, the signals provided by the display driving chip to the pixel circuit during the first initialization sub-stage t1 and the second initialization sub-phase t4 are the same with each other, and the heating driving chip provides an invalid signal to the control terminal of the heating control circuit.

The signals provided by the display driving chip to the pixel circuit during the first grayscale signal writing-compensating sub-stage t2 and the second grayscale signal writing-compensating sub-stage t5 are the same with each other, and the heating driving chip provides an invalid signal to the control terminal of the heating control circuit.

Figure 6:
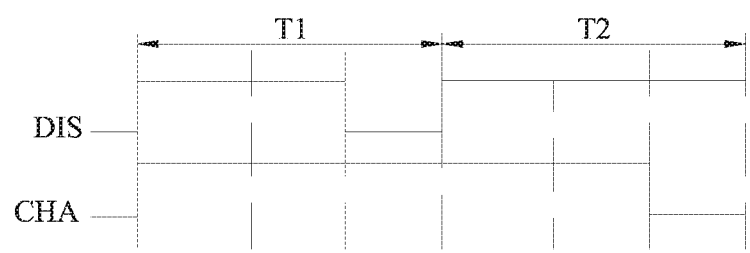
FIG. 6 is a diagram of signals for a heating stage and a display stage in an entire display period of a display panel provided in an embodiment of the present application.

FIG. 6 shows a timing diagram of signals at the control terminal DIS of the light emitting control sub-circuit and the control terminal CHA of the heating control circuit during the display stage and the light emitting stage.

The difference between the signal provided by the display driving chip to the pixel circuit during the heating sub-stage t6 and the signal provided by the display driving chip to the pixel circuit during the light emitting sub-stage t3 is that an invalid signal is provided to the control terminal of the light emitting sub-circuit during the heating sub-stage t6. That is to say, signals supplied by the display driving chip to the control terminal and the input terminal of the grayscale signal input sub-circuit of the pixel circuit during the heating sub-stage t6 are the same as signals supplied by the display driving chip to the control terminal and the input terminal of the grayscale signal input sub-circuit of the pixel circuit during the light emitting sub-stage t3, and signals supplied by the display driving chip to the control terminal and the input terminal of the reset sub-circuit of the pixel circuit during the heating sub-stage t6 are the same as signals supplied by the display driving chip to the control terminal and the input terminal of the reset sub-circuit of the pixel circuit during the light emitting sub-stage t3.

In addition, the heating driving chip provides a valid signal to the control terminal of the heating control circuit during the heating sub-stage, so that the input terminal and the output terminals of the heating control circuit can be electrically connected to form a heating loop.

In the embodiments of the present application, in some special cases (for example, when the operator is driving and it is inconvenient to watch the display screen), a valid control signal can be provided to the control terminal of the heating control circuit, so that the input terminal and the output terminal of the control circuit can be electrically connected. In this way, the first level signal terminal, the heating control circuit, the second electrode of the light emitting structure, and the second level signal terminal form a loop. Heat is generated when a current passes through the second electrode of the light emitting structure, and the hardness of a portion of the deforming layer corresponding to the heated second electrode increases. When the operator touches the surface of the display panel, the position to be operated can be distinguished by the difference in hardness, and corresponding operation can be performed.

It should be noted that the first electrode terminal of a transistor may be one of drain and source of the transistor an, and the second electrode terminal of the transistor may be the other of drain and source of the transistor.

It should be understood that, the foregoing embodiments are only exemplary embodiments used for explaining the principle of the present disclosure, but the present disclosure is not limited thereto. Various variations and improvements may be made by a person skilled in the art without departing from the spirit and essence of the present disclosure, and these variations and improvements also fall into the protection scope of the present disclosure.

The invention claimed is:

1. A display panel, comprising:
   a base substrate;
   a plurality of pixel units, each of which is provided with a light emitting structure therein, each light emitting structure includes a first electrode, a light emitting layer, and a second electrode sequentially stacked on the base substrate;
   a plurality of pixel circuits respectively disposed in the pixel units for driving the light emitting structure to emit light;
   a deforming layer disposed above the second electrode of the light emitting structure; and
   one or more heating control circuits respectively disposed in different pixel units and each electrically connected to the second electrode of the light emitting structure in a corresponding pixel unit in which the heating control circuit is provided;
   wherein the heating control circuit is configured to control the second electrode of the light emitting structure in the corresponding pixel unit to generate heat so that hardness of the deforming layer above the second electrode changes.

2. The display panel of claim 1, wherein the pixel circuit includes a driving sub-circuit, an input terminal of the driving sub-circuit is connected to a first level signal terminal, and an output terminal of the driving sub-circuit is connected to the first electrode of the light emitting structure, the second electrode of the light emitting structure is connected to a second level signal terminal, and an input terminal of the heating control circuit is connected to the output terminal of the driving sub-circuit of a corresponding pixel circuit, the output terminal of the heating control circuit is connected to the second electrode of the light emitting structure of the corresponding pixel circuit, the heating control circuit is configured to electrically connect the input terminal and the output terminal of the heating control circuit to control the second electrode of the light emitting structure in the corresponding pixel unit to generate heat when a valid signal is received by a control terminal of the heating control circuit, so that the hardness of the deforming layer above the second electrode of corresponding light emitting structure changes.

3. A display device, comprising the display panel of claim 2.

4. The display panel of claim 1, wherein the deforming layer includes a material of polymer hydrogel.

5. The display panel of claim 4, further comprising: an encapsulation layer disposed above the deforming layer to encapsulate the deforming layer.

6. The display panel of claim 5, wherein the encapsulation layer includes a material of tetrafluoroethylene.

7. A display device, comprising the display panel of claim 5.

8. A display device, comprising the display panel of claim 4.

9. The display panel of claim 1, wherein second electrodes of a plurality of light emitting structures are integrally formed to form a second electrode block, and a space is formed between adjacent second electrode blocks.

10. The display panel of claim 9, wherein one second electrode block is controlled by one heating control circuit.

11. The display panel of claim 1, wherein the heating control circuit includes a control transistor, a gate of the control transistor is connected to a control terminal of the heating control circuit, a first electrode terminal of the control transistor is connected to the input terminal of the heating control circuit, and a second electrode terminal of the control transistor is connected to the output terminal of the heating control circuit.

12. The display panel of claim 1, wherein the light emitting structure includes a light emitting diode, the first electrode is formed as an anode of the light emitting structure, and the second electrode is formed as a cathode of the light emitting structure, the pixel circuit further includes a grayscale signal input sub-circuit, a reset sub-circuit, and a light emitting control sub-circuit, wherein
the reset sub-circuit is configured to reset the control terminal of the driving sub-circuit;
an input terminal of the light emitting control sub-circuit is connected to the output terminal of the driving sub-circuit, an output terminal of the light emitting control sub-circuit is connected to the first electrode of the light emitting structure in the pixel unit in which the light emitting control sub-circuit is provided, and the input terminal and the output terminal of the light emitting control sub-circuit are electrically connected in a case where a valid control signal is received by the control terminal of the light emitting control sub-circuit.

13. The display panel of claim 12, wherein the driving sub-circuit includes a driving transistor and a storage capacitor, a gate of the driving transistor is connected to a first end of the storage capacitor, a first electrode terminal of the driving transistor is connected to the input terminal of the driving sub-circuit, and a second electrode terminal of the driving transistor is connected to the output terminal of the driving sub-circuit,
a second end of the storage capacitor is connected to the control terminal of the drive sub-circuit.

14. The display panel of claim 13, wherein the reset sub-circuit includes a first reset transistor and a second reset transistor, and a gate of the first reset transistor and a gate of the second reset transistor are both connected to the control terminal of the reset sub-circuit,
a first electrode terminal of the first reset transistor is connected to an initial signal input terminal, and a second electrode terminal of the first reset transistor is connected to the gate of the driving transistor;
a first electrode terminal of the second reset transistor is connected to the first level signal terminal, and a second electrode terminal of the second reset transistor is connected to the second end of the storage capacitor.

15. The display panel of claim 13, wherein the grayscale signal input sub-circuit comprises a first input transistor, a second input transistor, and a third input transistor, and a gate of the first input transistor is connected to the control terminal of the grayscale signal input sub-circuit, a first electrode terminal of the first input transistor is connected to an output terminal of the grayscale signal input sub-circuit, and a second electrode terminal of the first input transistor is connected to the input terminal of the signal input sub-circuit;
a first electrode terminal of the second input transistor is connected to a reference voltage input terminal, and a second electrode terminal of the second input transistor is connected to the output terminal of the grayscale signal input sub-circuit;
a gate of the third input transistor is connected to the gate of the first input transistor, a first electrode terminal of the third input transistor is connected to the first end of the storage capacitor, and a second electrode terminal of the third input transistor is connected to the output terminal of the driving sub-circuit.

16. The display panel of claim 12, wherein the light emitting control sub-circuit includes a light emitting control transistor, a first electrode terminal of the light emitting control transistor is connected to the input terminal of the light emitting control sub-circuit, a second electrode terminal of the light emitting control transistor is connected to the output terminal of the light emitting control sub-circuit, and a gate of the light emitting control transistor is connected to the control terminal of the light emitting control sub-circuit.

17. A display device, comprising the display panel of claim 1.

18. The display device of claim 17, further comprising a heating driving chip and a display driving chip,
the display driving chip is capable of driving the display panel to display selective instructions;
the heating driving chip is configured to provide a valid signal to the control terminal of the heating control circuit corresponding to an area of the display panel where the selective instructions are displayed when the display driving chip displays the selective instructions, so that the second electrode of the light emitting structure in a corresponding pixel unit generates heat.

19. The display device of claim 18, wherein when the display driving chip drives the display panel to display the selective instructions, a display period of the display device includes a display stage and/or a heating stage, wherein
the display driving chip is configured to provide a display signal to the pixel circuit corresponding to the area for displaying the selective instructions during the display stage; and
the heating driving chip is configured to provide a valid signal to the control terminal of the heating control circuit corresponding to the area displaying the selective instructions during the heating stage.

20. The display device of claim 19, wherein the display stage comprises a first initialization sub-stage, a first grayscale signal writing-compensating sub-stage and a light emitting sub-stage, and the heating stage includes a second initialization sub-stage, a second grayscale signal writing-compensating sub-stage and a heating sub-stage, wherein
during the first initialization sub-stage and the second initialization sub-stage, signals provided by the display driving chip to pixel circuit are the same with each other, and the heating driving chip provides an invalid signal to the control terminal of the heating control circuit;
during the first grayscale signal writing-compensating sub-stage and the second grayscale signal writing-compensating sub-stage, signals provided by the display driving chip to the pixel circuit are the same with other, and the heating driving chip provides an invalid signal to the control terminal of the heating control circuit;
the display driving chip provides a valid signal to the control terminal of the light emitting control sub-circuit during the heating sub-stage, and provides an invalid signal to the control terminal of the light emitting control sub-circuit during the light emitting sub-stage; and
the heating driving chip provides a valid signal to the control terminal of the heating control circuit during the heating sub-stage.

* * * * *